(12) United States Patent
Sakuma et al.

(10) Patent No.: US 6,377,332 B1
(45) Date of Patent: Apr. 23, 2002

(54) OPTICAL MEMBER FOR PHOTOLITHOGRAPHY AND PHOTOLITHOGRAPHY APPARATUS

(75) Inventors: Shigeru Sakuma, Chigasaki; Masaki Shiozawa, Sagamihara, both of (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/494,039

(22) Filed: Jan. 31, 2000

(30) Foreign Application Priority Data

Feb. 3, 1999 (JP) .......................................... 11-026746
Feb. 16, 1999 (JP) .......................................... 11-037481

(51) Int. Cl.[7] ........................ G03B 27/42; G03B 27/54; G02B 13/14; F21V 9/06
(52) U.S. Cl. ............................ 355/53; 355/67; 359/355; 359/361
(58) Field of Search .............................. 355/53, 67, 52, 355/71, 77; 250/548; 359/350, 355, 361

(56) References Cited

U.S. PATENT DOCUMENTS 5,031,977 A * 7/1991 Gibson ....................... 350/1.4
5,978,070 A * 11/1999 Sakuma et al. .............. 355/53
6,061,174 A * 5/2000 Shiozawa et al. ........... 359/361

FOREIGN PATENT DOCUMENTS

| JP | A-7-281001 | 10/1995 |
| JP | A-9-255328 | 9/1997 |

OTHER PUBLICATIONS

Zhurnal Prikladnoi Spektroskopii, vol. 32, No. 1, pp. 103–109, Jan. 1980, "Impurity absorption of rare–earth fluoride crystals in the vacuum ultraviolet region", V.A. Arkhangel et al.

J. Vac. Sci. Technol. B vol. 15, No. 6, Nov./Dec. 1997, "Lithography with 157 nm lasers", T.M. Bloomstein et al., pp. 2112–2116.

* cited by examiner

Primary Examiner—Alan A. Mathews
Assistant Examiner—Hung Henry Nguyen
(74) Attorney, Agent, or Firm—Oliff & Berridge PLC (57) ABSTRACT

An optical member for photolithography made of a calcium fluoride crystal exhibits an internal transmittance of 99.5%/cm or greater with respect to light having a specific wavelength of 185 nm or shorter.

22 Claims, 6 Drawing Sheets

OPTICAL MEMBER FOR PHOTOLITHOGRAPHY AND PHOTOLITHOGRAPHY APPARATUS

BACKGROUND OF THE INVENTION

1. Field of the Invention

The present invention relates to an optical member for photolithography made of a calcium fluoride crystal, and a photolithography apparatus using this optical member; and, more specifically, to an optical member made of a calcium fluoride crystal which is employed in a stepper or scanner which is a photolithography apparatus using, for its exposure light source, an $F_2$ laser (157 nm), an ArCl excimer laser (175 nm), a $Kr_2$ excimer laser (146 nm), an $Ar_2$ excimer laser (126 nm), a solid-state laser utilizing a non-linear optical effect, or other ultraviolet rays, and a photolithography apparatus using this optical member.

2. Related Background Art

In recent VLSI (Very Large Scale Integration), density and function have become higher, thus requiring finer processing techniques on a wafer. As a method of its processing, one based on photolithography is carried out in general. At present, the exposure wavelength is becoming shorter, and a stepper using ArF excimer laser light (having a wavelength of 193 nm) is expected to appear soon. Since typical optical materials absorb light having a wavelength not longer than 193 nm, materials employable in optical members for photolithography are quite limited. While specific examples thereof include lithium fluoride crystals, magnesium fluoride crystals, calcium fluoride crystals, barium fluoride crystals, strontium fluoride crystals, and silica glass, optical members are often designed by use of two kinds of materials constituted by a calcium fluoride crystal and silica glass in general.

Also, attempts are being made to further shorten the wavelength of the light source in order to effect finer processing, and demands for photolithography utilizing vacuum ultraviolet rays such as $F_2$ laser light (having a wavelength of 157 nm) have been increasing in recent years. Since silica glass exhibits a low transmission property with respect to such light, however, it is not considered to be suitably usable as the material for optical members. Therefore, optical members made of calcium fluoride crystals have been under development.

Conventionally, calcium fluoride crystals have been made by such methods as Bridgman-Stockbarger method (crucible descending method), Czochralski method, and the like. Among others, Bridgman-Stockbarger method is in wide use since it is advantageous in that crystal growth is carried out while being kept from contamination from the air and in that it can make a large crystal. In this method, a fluorinating agent (e.g., lead fluoride or the like) known as scavenger is added to synthesized powders of calcium fluoride whose amount of impurities is low, the resulting mixture is sealed in a crucible and heated in a vacuum so as to be melted, and then the crucible is descended at a velocity of 0.5 to 5 mm/hour so as to effect crystal growth. Thus obtained calcium fluoride crystal is subjected to a heat treatment for eliminating thermal stress, and then is cut and processed, so as to become a material for an optical member.

From thus obtained material, prisms, mirrors, and various lenses are manufactured as optical members for photolithography. These optical members are subjected to optical grinding with a required precision, and are formed with a required coating.

If a member used in an optical system of a photolithography apparatus absorbs light, then its influence on the whole optical system is strong even when the amount of absorption is very little. Specifically, there occurs such a problem that not only its throughput (light transmission property of the whole optical system) is unfavorable, but also light absorption causes the temperature of optical members (lenses) to rise, thereby deteriorating imaging performances. Therefore, for establishing a photolithography technique utilizing vacuum ultraviolet rays, it is very important that slight absorption in optical members be suppressed. In the optical members made of calcium fluoride crystals manufactured by conventional methods, however, it has been difficult to obtain desired optical performances.

Also, the above-mentioned optical members are required to have a high durability, i.e., to be kept from deteriorating their transmittance when irradiated with light. Japanese Patent Application Laid-Open No. HEI 7-281001 discloses, as a fluorite for ultraviolet optics employed in ultraviolet optical systems, one whose internal transmittance is at least 90.0% per 10 mm when irradiated with $10^4$ to $10^7$ shots of laser light at 50 to 500 Hz having an energy density of 50 to 500 $mJ/cm^2$/pulse. When vacuum ultraviolet light of 185 nm or under such as $F_2$ laser light is utilized, however, the energy density of light emitted from the light source is 50 $mJ/cm^2$/pulse or less, and the energy density of light irradiating a member distanced from the light source or a member used in a projection optical system is 0.5 $mJ/cm^2$/pulse or less, which is much lower. Therefore, optical members are required to maintain their internal transmittance at a higher level with respect to light having such a low energy density, whereas materials exhibiting an internal transmittance of 90.0% per 10 mm after light irradiation are insufficient as those for optical members.

One of the reasons why optical members having desired optical performances have been hard to develop as mentioned above is the lack of means for measuring their optical characteristics precisely.

For example, Japanese Patent Application Laid-Open No. HEI 9-255328 discloses a fluorite whose internal transmittance with respect to light having a wavelength of 135 nm is 70% or greater, whereas this internal transmittance is measured for a sample having a substrate thickness of 20 mm by use of a vacuum ultraviolet spectrophotometer. In such a typical measuring method, however, though it can be seen that the internal transmittance is about 70%, for example, it is difficult to carry out measurement with such a high accuracy as to determine whether it is 70.1% or 70.3%.

SUMMARY OF THE INVENTION

Therefore, it is an object of the present invention to provide an optical member suitably employable in a photolithography apparatus having an optical system which uses light having a specific wavelength of 185 nm or shorter as a light source, and a photolithography apparatus using the same.

The inventors have studied a method of accurately measuring the internal transmittance of an optical member exhibiting only slight optical absorption by use of a typical spectrophotometer for a vacuum ultraviolet region. As a result of repeated diligent studies using this measuring method, the inventors have accomplished the present invention concerning an optical member suitably employable in an optical system which uses light having a specific wavelength of 185 nm or shorter as a light-source, and a photolithography apparatus using the same.

Namely, the optical member in accordance with the present invention is an optical member for photolithography made of a calcium fluoride crystal exhibiting an internal transmittance of 99.5%/cm or greater with respect to light having a specific wavelength of 185 nm or shorter.

Also, the photolithography apparatus in accordance with the present invention is a photolithography apparatus comprising an exposure light source for emitting light having a wavelength of 185 nm or shorter, a mask formed with an original image of a pattern, an irradiation optical system for irradiating the mask with the light emitted from the light source, a projection optical system for projecting onto a photosensitive substrate a pattern image projected from the mask, and an alignment system for aligning the mask and the photosensitive substrate with each other;

wherein at least a part of optical members constituting the irradiation optical system and projection optical system is made of a calcium fluoride crystal exhibiting an internal transmittance of 99.5%/cm or greater with respect to light having a specific wavelength of 185 nm or shorter.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DESCRIPTION OF THE PREFERRED EMBODIMENTS

In the following, an optical member for photolithography in accordance with the present invention and a photolithography apparatus using the same will be explained in detail.

The optical member in accordance with the present invention is made of a calcium fluoride crystal exhibiting an internal transmittance of 99.5%/cm or greater with respect to light having a specific wavelength of 185 nm or shorter; and, when used in an optical system of a photolithography apparatus, can satisfy required properties such as throughput and imaging performances. In the case of a projection lens for a stepper, for example, its total optical path length may reach 200 mm or over. Assuming that the total optical path length is 200 mm, for example, if incident light loses its intensity by only 1% every time it advances by 10 mm, then the final light intensity is $0.99^{20}=0.818$, i.e., decreases to 82%. Also, if this loss of 1% is attributable to the internal absorption in the lens, then it causes temperature rises and refractive index changes in the lens, thereby deteriorating imaging performances. In the case of optical members made of calcium fluoride crystals, the deterioration in imaging performances is greatly influenced by the refractive index changes in particular.

The internal transmittance required for the abovementioned optical member is also verified from results of a simple estimation of influences of light absorption in an optical member as follows:

In the case where an $F_2$ laser (having a wavelength of 157 nm) is employed as a light source, by way of example, the reflectivity R at an optical member surface is represented by the following expression (1):

$$R=(n-1)^2/(n+1)^2 \qquad (1)$$

where n indicates the refractive index of the optical member. Also, the relationship between the transmittance Tr taking account of the multiple reflection loss at the optical member surface and the internal transmittance Ti is represented by the following expression (2):

$$Tr=(1-R)^2 \cdot Ti/(1-R^2 \cdot Ti^2) \qquad (2)$$

Here, since the absolute refractive index with respect to light having a wavelength of 157 nm is 1.56, R=0.048. The transmittance taking account of reflection loss corresponding to an internal transmittance of 99.5% becomes 90.4% by use of expression (2). Meanwhile, the transmittance taking account of reflection loss corresponding to an internal transmittance of 100% is 90.9%.

Further, in the optical member of the present invention, it is preferred that the amount of decrease in internal transmittance after light irradiation be smaller. In the case of an $F_2$ laser, by way of example, one made of LAMBDA PHYSIK, Inc. having a repetition rate of 500 Hz and an average output of 10 W is known as an industrial $F_2$ laser which is commercially available at present. When light having this energy irradiates an area having a diameter of 10 mm, an energy density of $10/500/((\pi/4)1\times 1)\times 1,000=25.5$ [mJ/cm$^2$/pulse] is attained. Though this energy density may exceed 50 mJ/cm$^2$/pulse if the output of the laser itself increases, the energy density not greater than this level is currently used in general. When irradiated with light having such a low energy density, the energy loss due to the absorption and scattering of light in the coat portion of the optical member becomes much worse than that yielded when irradiated with light having a wavelength longer than 185 nm. Also, since the moisture and hydrocarbons adhering to optical device surfaces result in energy loss, it is desirable that the energy loss within the optical member be smaller in order to obtain a desirable quantity of light in an optical system in which such members are combined together, whereby a higher internal transmittance is required for the optical member. Further, it is preferred that characteristics of such an optical member be maintained at a high level. Specifically, it is preferred that the amount of decrease in internal transmittance when irradiated with light having an energy density of 50mJ/cm$^2$/pulse or less be 0.5%/cm or less.

As mentioned above, the optical member of the present invention having conventionally unachievable optical characteristics is attained only when a calcium fluoride crystal obtained by a specific manufacturing method is used as its material. The method of making a calcium fluoride crystal which becomes a material for the optical member in accordance with the present invention will now be explained.

In the present invention, the calcium fluoride crystal is manufactured by use of Bridgman-Stockbarger method. In this method, a scavenger (fluorinating agent) is added to a powder material of calcium fluoride, the resulting mixture is heated and melted in a vacuum so as to prepare a polycrystalline substance, this polycrystalline substance is filled in a crucible and once melted, and then the crucible is descended in a system having a temperature gradient [°C./cm] near the melting point of calcium fluoride under a predetermined distance and velocity condition, so as to carry out crystal growth.

In the making of the calcium fluoride crystal used in the optical member of the present invention, lead fluoride or a fluorine resin is used as the scavenger. These scavengers are stable at the room temperature and decompose a temperature which is lower than the melting point (1370–1410° C.) of calcium fluoride. These scavengers are preferable in that products generated by a decomposition of these scavengers and by a reaction of these scavengers with oxygen efficiently volatilyze without remaining in the calcium fluoride crystal.

In the case where lead fluoride is used as the scavenger, it is necessary that the temperature gradient at the time of crystal growth be at least 11° C./cm but not greater than 20° C./cm in order to obtain a calcium fluoride crystal having a high transmission property and durability. In the case where the above-mentioned temperature gradient is less than 11° C./cm, the high transmission property and durability cannot be obtained. In the case where the above-mentioned temperature gradient exceeds 20° C./cm, by contrast, a temperature difference occurs between the center part and outer periphery part of the melted liquid within the crucible, which generates a convection, whereby inclusions such as bubbles may be taken into a crystal, or a polycrystal may be formed. Hence, these cases are unfavorable.

Similarly, when a fluorine resin is used as the scavenger, it is necessary that the temperature gradient at the time of crystal growth be at least 9° C./cm but not greater than 20° C./cm in order to obtain a calcium fluoride crystal having a high transmission property and durability. In the case where the above-mentioned temperature gradient is less than 9° C./cm, the high transmittance and durability cannot be obtained. In the case where the above-mentioned temperature gradient exceeds 20° C./cm, by contrast, a temperature difference occurs between the center part and outer periphery part of the melted liquid within the crucible, which generates a convection, whereby inclusions such as bubbles may be taken into a crystal, or a polycrystal may be formed. Hence, these cases are unfavorable.

One of the reasons why the optical member in accordance with the present invention made of the calcium fluoride crystal obtained by the above-mentioned method has a high transmission property and durability is presumed to be because of the fact that the amount of impurities such as lead, water, and oxygen remaining in the crystal is very low. For example, a calcium fluoride crystal with lead remaining therein has three absorption bands at 204 nm, 164 nm, and 154 nm (Zhurnal Prikladnoi Spektroskopii, vol. 32, 103 (1980)). Among the above-mentioned three absorption bands, those at 164 nm and 154 nm become problematic when light having a specific wavelength of 185 nm or shorter is utilized. In particular, the absorption band at 154 nm is considered to adversely affect the transmission property and durability of the optical member when $F_2$ laser light is utilized.

An example of a method of accurately measuring the internal transmittance of the optical member made of thus obtained calcium fluoride crystal comprises:

a step of cutting out a measurement sample having a thickness of 30 mm or greater from an optical member made of a calcium fluoride crystal;

a step of actually measuring the transmittance of the measurement sample with respect to light having a specific wavelength of 185 nm or shorter; and a step of excluding the influence of the decrease in transmittance corresponding to the surface reflection loss, so as to calculate the internal transmittance per unit thickness. Details of this measuring method will be shown in the following.

Specific examples of the light source for photolithography or laser processing machines utilizing light having a wavelength of 185 nm or shorter include an $F_2$ laser (157 nm), an ArCl excimer laser (175 nm), a $Kr_2$ excimer laser (146 nm), an $Ar_2$ excimer laser (126 nm), and a solid-state laser utilizing a nonlinear optical effect. Light having a wavelength in such a region is known as vacuum ultraviolet light, and is not transmitted through the air since it is absorbed by oxygen. Therefore, a spectrophotometer for measuring the transmittance or reflectivity of an optical member is disposed in a vacuum or in an inert gas atmosphere shielded from oxygen. This measurement is usually carried out in a vacuum evacuated by a vacuum pump.

Though some spectrophotometers for vacuum ultraviolet regions are commercially available, their loss in light quantity within apparatus is large, and their detectors have a low sensitivity, whereby their accuracy in measurement is lower than that in spectrophotometers for visible and ultraviolet regions. The reasons therefor are not only the restriction caused by the vacuuming of the system, but also various factors such as the increase of loss in internal optical parts due to the shortening of wavelength, problems of sensitivity in the detector, and the like. Yet, as compared with other methods such as a method which directly measures the transmittance while using the $F_2$ laser or other excimer lasers as a light source, for example, the measuring method using a spectrophotometer is superior in terms of the convenience of handling and the accuracy in measurement, whereby the measurement based on this method is common. A spectrophotometer is used for measuring the internal transmittance of the calcium fluoride crystal, employed as the material for the optical member of the present invention, with respect to light having a specific wavelength of 175 nm, 157 nm, 146 nm, 126 nm, or the like as well.

Optical members employed in photolithography apparatus have various dimensions, and include those whose diameter exceeds 150 mm. It is difficult to measure the transmittance of such a member itself due to the restriction of the sample chamber in the spectrophotometer, and the like. In the present invention, a part of the calcium fluoride crystal employed as the material for the optical member was cut into a size (e.g., a diameter of 20 to 70 mm with a thickness of 30 to 50 mm) easily measurable with the spectrophotometer, and was measured thereby.

In the measurement of internal transmittance using a typical spectrophotometer, it is very difficult to measure the internal transmittance with respect to light having a specific wavelength of 185 nm or shorter with an accuracy of 0.1% due to various factors in addition to those in the measuring instrument. According to experiments of the inventors, even when a sample is mirror-polished, an error of about ±0.5% may occur depending on the surface state. Namely, the difference between 90.4% and 90.9% may not be discernible. Hence, the inventors have increased the thickness of the substrate to be measured, so as to reduce the influence of measurement errors, thereby clarifying fine differences in internal absorption. That is, in case the internal transmittance is 99.5%/cm, the internal transmittance obtained when the substrate thickness is 30 mm becomes $0.995^3 = 0.985$, and is 89.5% when taking account of reflection loss. If the internal transmittance is 100%, then the transmittance taking account of reflection loss is 90.9% regardless of the substrate thickness. Namely, it can be seen that the internal transmittance is 99.5%/cm or greater if the transmittance of a substrate having a thickness of 30 mm is measured and thus measured value is 89.5% or greater. Also, even when the accuracy in measurement is ±0.5%, it will decrease to ±0.2%/cm if the substrate thickness is converted into 10 mm, whereby the internal transmittance can be guaranteed. This method enables measurement to be carried out with a favorable accuracy by use of a commercially available vacuum ultraviolet spectrophotometer.

While the substrate thickness of the measurement sample is restricted to 30 mm in the foregoing explanation, the method of measuring the internal transmittance in the present invention is based on the inventors' finding that the internal transmittance with respect to light having a specific wavelength of 185 nm or shorter can be measured with a very high accuracy when the sample has a specific thickness or greater. Specifically, it is preferred that the thickness of the sample be 30 mm or greater in the method of measuring the internal transmittance of the optical member in accordance with the present invention.

Though the internal transmittance of the calcium fluoride crystal is measured in the present invention, the transmittance can also be measured accurately in other materials by use of the above-mentioned measuring method. For example, the above-mentioned method is also applicable to crystal materials such as lithium fluoride, magnesium fluoride, barium fluoride, and strontium fluoride which are materials excellent in transmittance at a wavelength of 185 nm or shorter. Also, the light source employed is not restricted to the $F_2$ laser (157 nm), whereas the transmittance with respect to light emitted from light sources such as the ArCl excimer laser (175 nm), $Kr_2$ excimer laser (146 nm), and $Ar_2$ excimer laser (126 nm) can be measured.

As an example of the photolithography apparatus in accordance with the present invention, a projection exposure apparatus using an $F_2$ laser as its light source will now be explained. Details of an optical system of a projection exposure apparatus using an $F_2$ laser as its light source are described in detail in PCT Application No. PCTJP99/07225.

Figure 1:
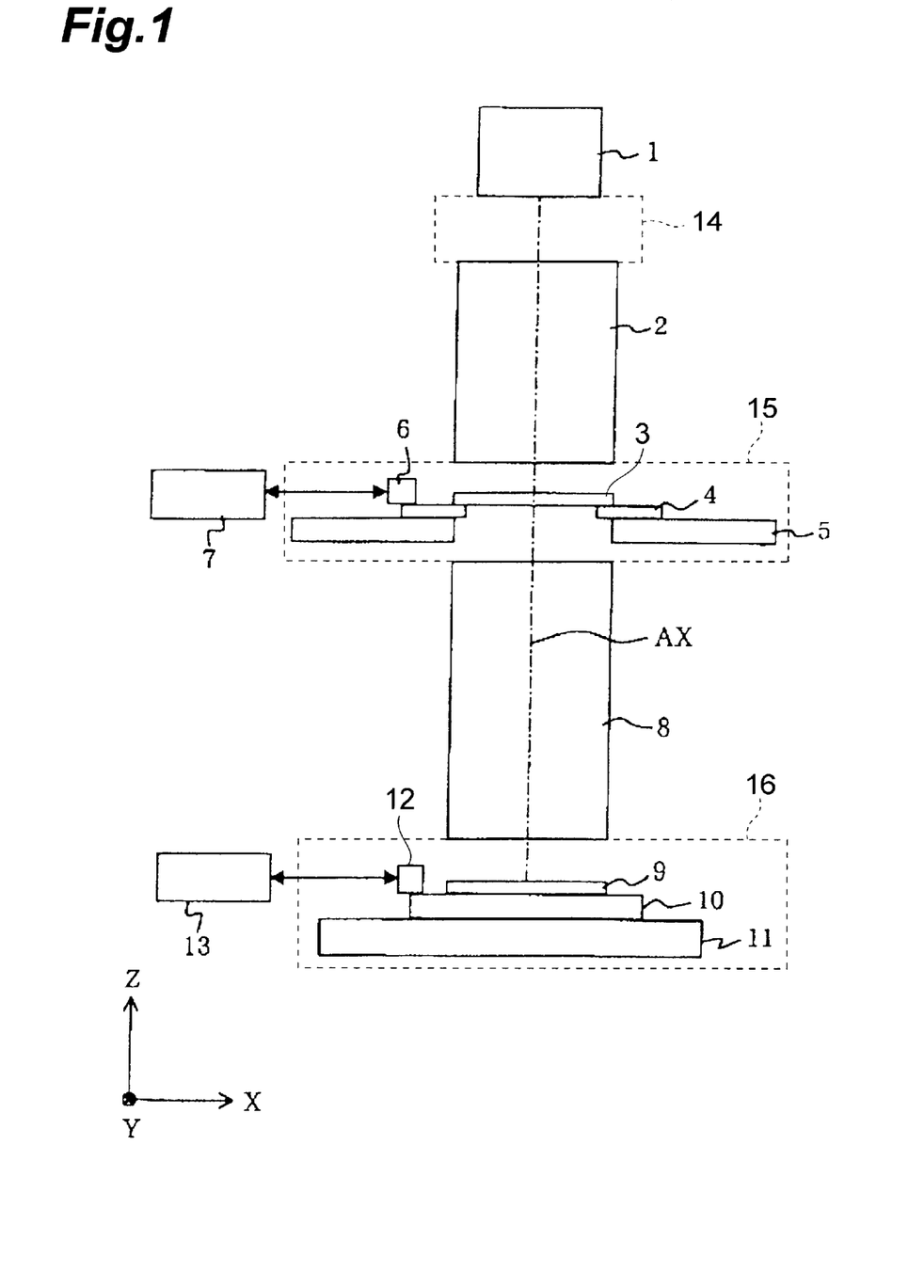
FIG. 1 is a schematic view showing an overall configuration of a projection exposure apparatus equipped with a catadioptric optical system in accordance with the present invention.

FIG. 1 is a schematic view showing the overall configuration of a projection exposure apparatus equipped with a catadioptric optical system in accordance with the present invention. Here, in FIG. 1, Z axis is set parallel to the optical axis AX of the catadioptric optical system 8 constituting a projection optical system, X axis is set parallel to the paper surface of FIG. 1 within a plane parallel to the optical axis AX, and Y axis is set perpendicular to the paper surface.

The projection exposure apparatus of FIG. 1 is equipped with an $F_2$ laser (having an oscillation center wavelength of 157.6 nm) as a light source for supplying illumination light in an ultraviolet region. The light emitted from the light source 1 uniformly illuminates, by way of an illumination optical system 2, a mask formed with a predetermined pattern.

In the optical path from the light source 1 to the illumination optical system 2, one or a plurality of bending mirrors for deflecting the optical path are disposed as necessary. Also, the illumination optical system 2 has an optical integrator, constituted by a flyeye lens or an inner surface reflection type integrator, for example, for forming a surface light source with a predetermined size/shape; a field stop for defining the size/shape of the illumination area on a mask 3; and an optical system such as a field stop imaging optical system for projecting an image of the field stop onto the mask. Further, the optical path between the light source 1 and the illumination optical system 2 is sealed with a casing 14, whereas the space extending from the light source 1 to the optical member closest to the mask in the illumination optical system 2 is substituted by an inert gas exhibiting a low absorption ratio with respect to the exposure light.

By way of a mask holder 4, the mask 3 is held parallel to the XY plane on a mask stage 5. The mask 3 is formed with a pattern to be transferred; whereas, within the whole pattern area, a rectangular (slit-shaped) pattern area having longer sides along the Y axis and shorter sides along the X axis is illuminated.

The mask stage 5 is movable in a two-dimensional fashion along the mask surface (XY plane), whereas its positional coordinates are configured so as to be measured and positionally controlled by an interferometer 7 using a mask movable mirror 6.

By way of the catadioptric projection optical system 8, the light from the pattern formed in the mask 3 forms a mask pattern image onto a wafer 9 which is a photosensitive substrate. The wafer 9 is held parallel to the XY plane on a wafer stage 11 by way of a wafer holder 10. Also, on the wafer 9, a pattern image is formed in a rectangular exposure area having longer sides along the Y axis and shorter sides along the X axis so as to optically correspond to the rectangular illumination area on the mask 3.

The wafer stage 11 is movable along the wafer surface (XY plane) in a two-dimensional fashion, whereas its positional coordinates are configured so as to be measured and positionally controlled by an interferometer 13 using a wafer movable mirror 12.

Also, in the depicted projection exposure apparatus, the inside of the projection optical system 8 is configured so as to keep an airtight state, whereas the gas within the projection optical system 8 is substituted by an inert gas.

Further, while the mask 3, the mask stage 5, and the like are disposed in a narrow optical path between the illumination optical system 2 and the projection optical system 8, the inside of a casing 15 sealing and surrounding the mask 3, mask stage 5, and the like is filled with an inert gas.

Also, while the wafer 9, the wafer stage 11, and the like are disposed in a narrow optical path between the projection optical system 8 and the wafer 9, the inside of a casing 16 sealing and surrounding the wafer 9, wafer stage 11, and the like is filled with nitrogen or an inert gas such as helium gas.

Thus, an atmosphere which hardly absorbs exposure light is formed over the whole optical path from the light source 1 to the wafer 9.

As mentioned above, the field area (illumination area) on the mask 3 defined by the projection Optical system 8 and the projection area (exposure area) on the wafer 9 are shaped like a rectangle having shorter sides along the X axis. Hence, as the mask stage 5 and the wafer stage 11, and the mask 3 and the wafer 9, in consequence, are synchronously moved (scanned) along the shorter sides of the rectangular exposure area and illumination area, i.e., X axis, while the mask 3 and the wafer 9 are positionally controlled by use of a driving system, the interferometers (7, 13), and the like, the mask pattern is scanned and exposed on the wafer 9 with respect to an area having a width equal to the longer sides of the exposure area and a length corresponding to the amount of scanning (amount of movement) of the wafer 9.

In FIG. 1, a calcium fluoride crystal is used as a material for all the refractive optical members (lens components) constituting the projection optical system 8. Here, it is preferable that at least a part of the above-mentioned optical members is the optical member of the present invention, and it is more preferable that each of all the optical members is the optical member of the present invention.

Figure 2:
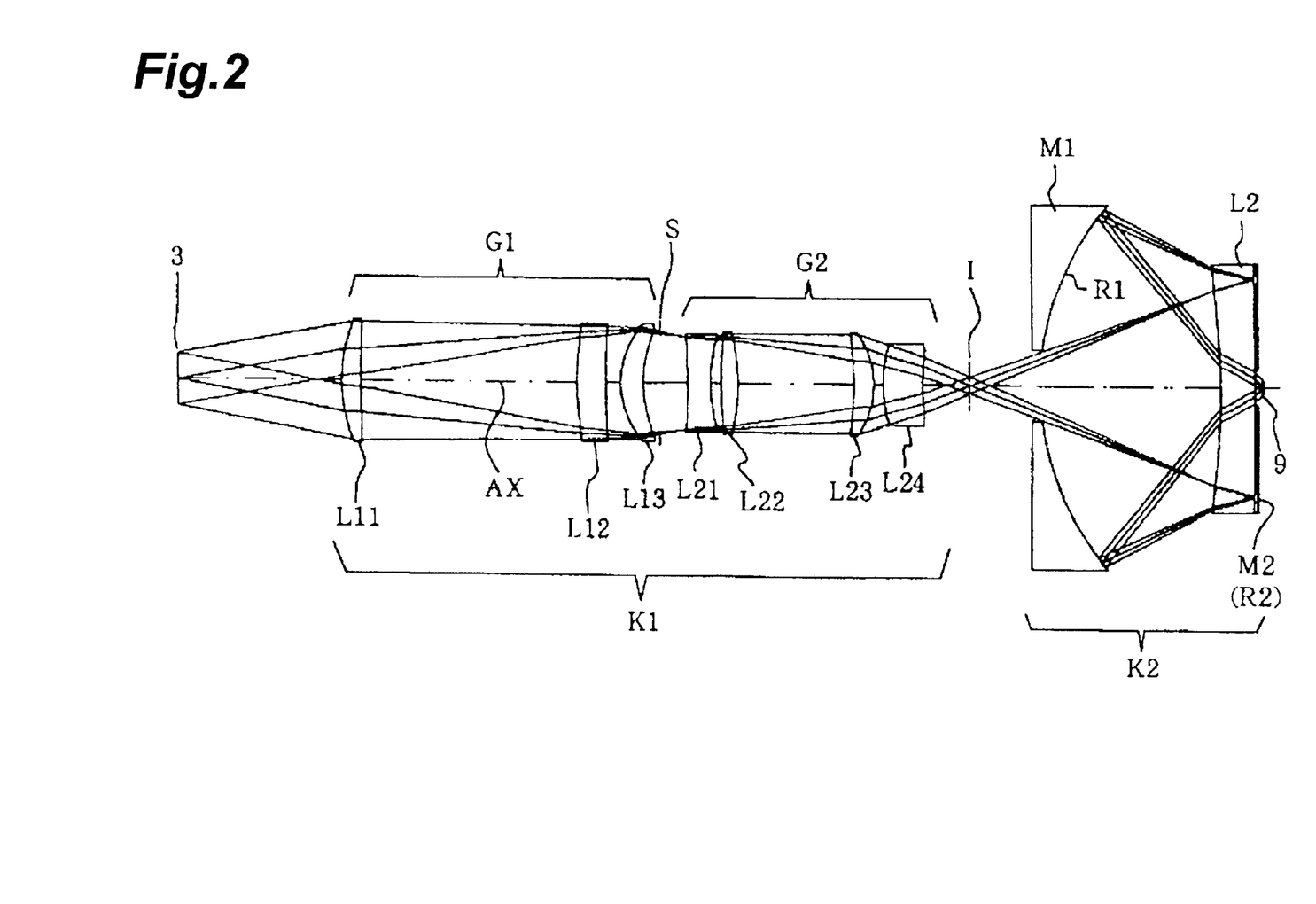
FIG. 2 is a schematic view showing a lens configuration of the catadioptric optical system (projection optical system) in accordance with FIG. 1.
Figure 3:
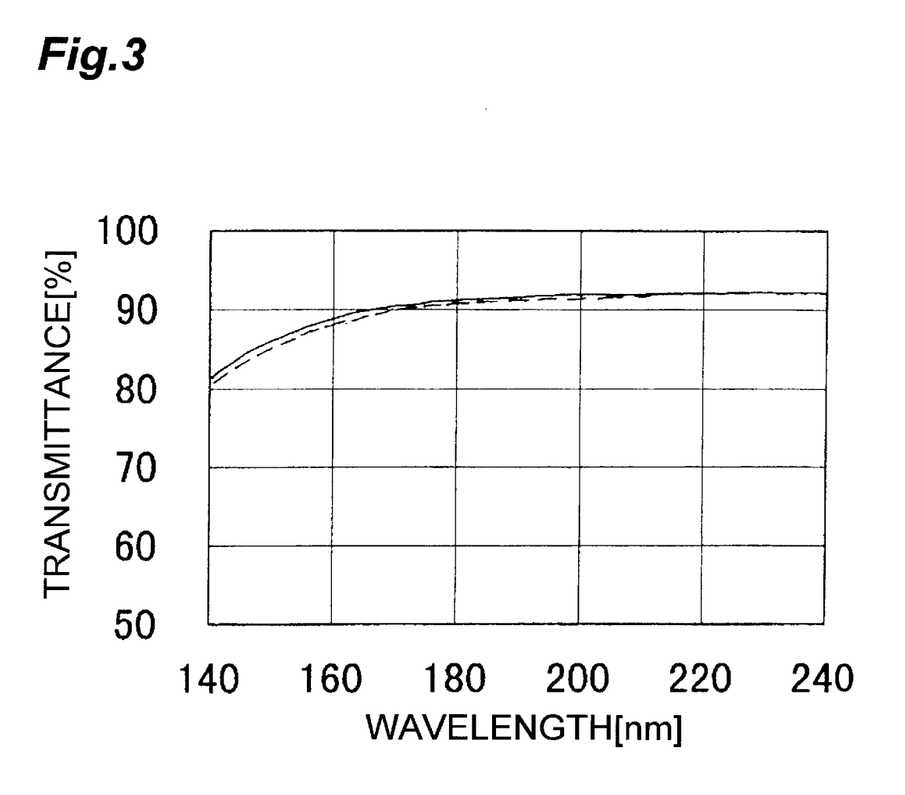
FIG. 3 is a graph showing the spectral transmittance of a calcium fluoride crystal (Table 1, Example 1, sample thickness: 30 mm) employable as a material for the optical member in accordance with the present invention, in which solid and broken lines indicate the spectral transmittance characteristics before and after light irradiation with respect to light emitted from an $F_2$ laser, respectively.
Figure 4:
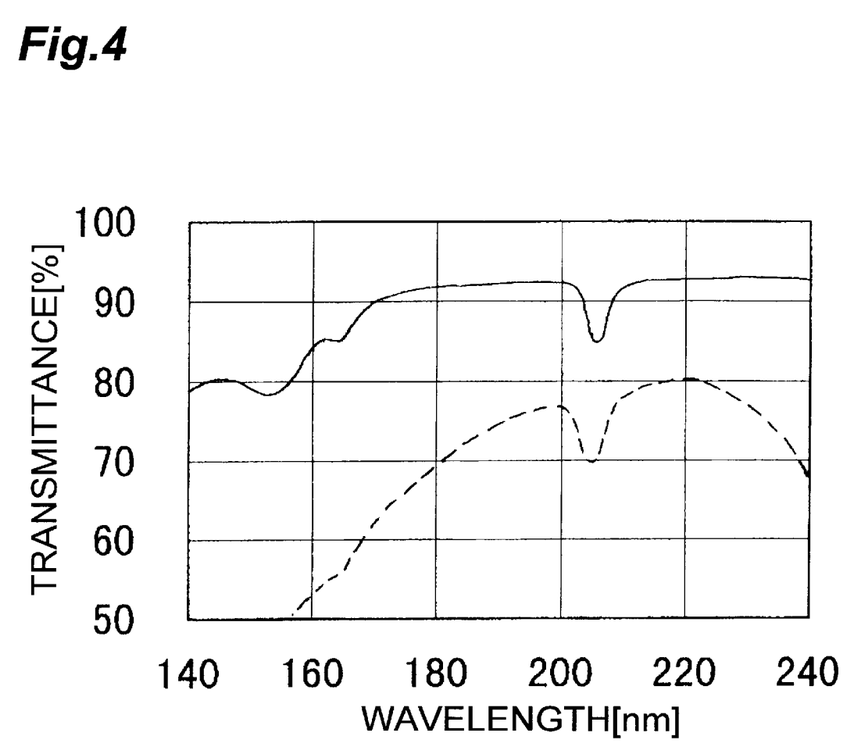
FIG. 4 is a graph showing the spectral transmittance of a calcium fluoride crystal (Table 1, Comparative Example 2, sample thickness: 30 mm) made by a conventional method, in which solid and broken lines indicate the spectral transmittance characteristics before and after light irradiation with respect to light emitted from the $F_2$ laser, respectively.
Figure 5:
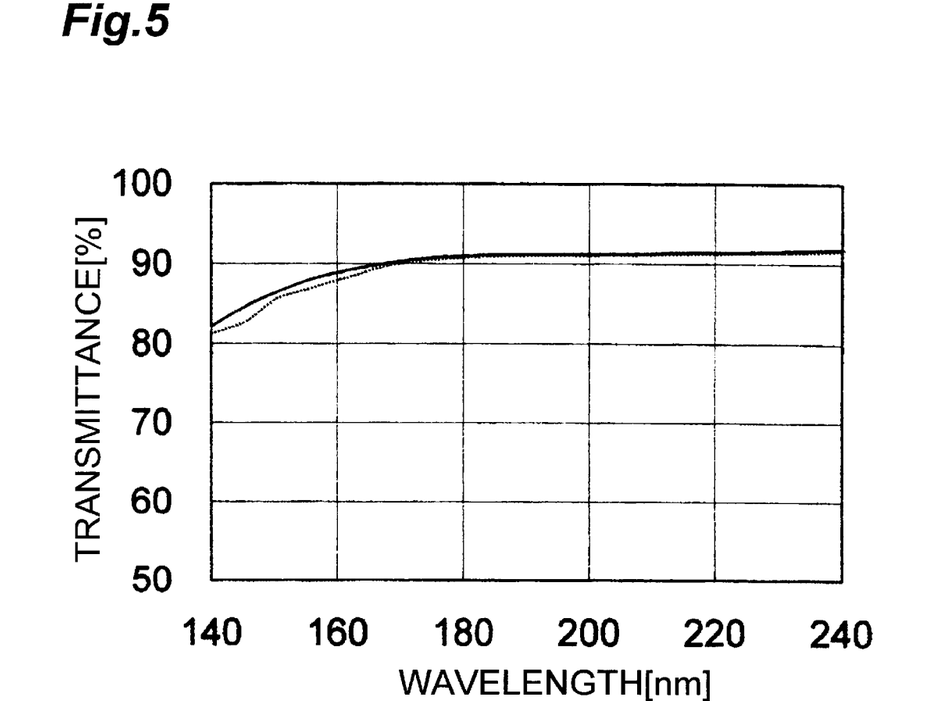
FIG. 5 is a graph showing the spectral transmittance of a calcium fluoride crystal (Table 1, Example 2, sample thickness: 30 mm) employable as a material for the optical member in accordance with the present invention, in which solid and broken lines indicate the spectral transmittance characteristics before and after light irradiation with respect to light emitted from an $F_2$ laser, respectively.
Figure 6:
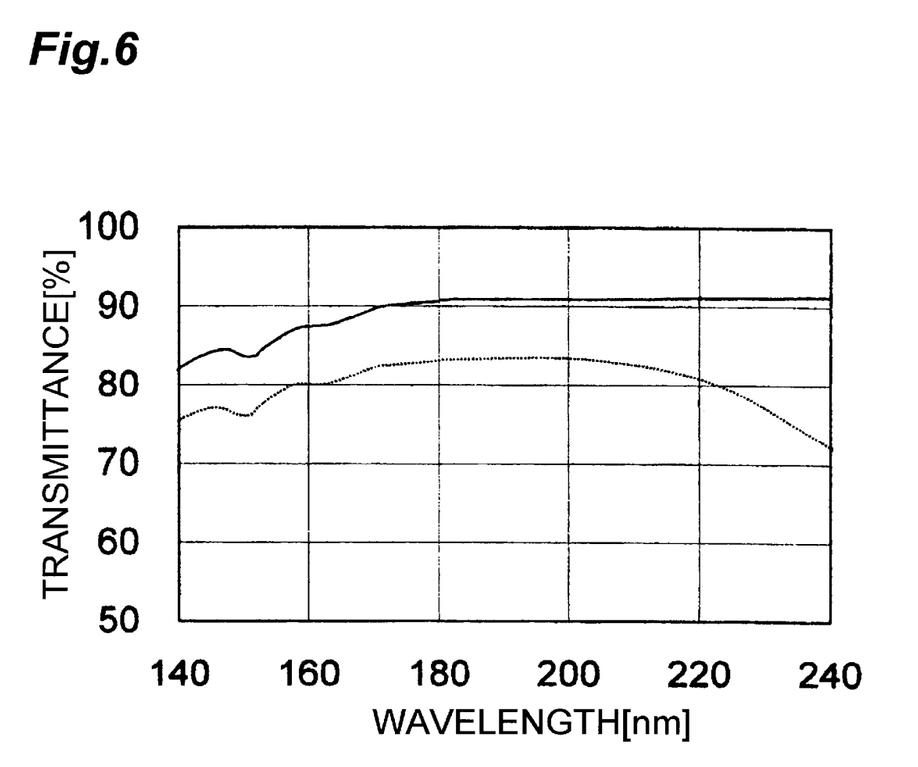
FIG. 6 is a graph showing the spectral transmittance of a calcium fluoride crystal (Table 1, Comparative Example 3, sample thickness: 30 mm) made by a conventional method, in which solid and broken lines indicate the spectral transmittance characteristics before and after light irradiation with respect to light emitted from the $F_2$ laser, respectively.

FIG. 2 is a schematic view showing the lens configuration of the catadioptric optical system (projection optical system 8) in accordance with FIG. 1.

The projection optical system composed of the catadioptric optical system of FIG. 2 is constituted by a first imaging optical system K1 for forming a primary image (intermediate image) I of the pattern of the mask 3, and a second imaging optical system K2 for forming, under a reduced magnification, a secondary image of the mask pattern according to light from the primary image I onto the wafer 9, which is a photosensitive substrate.

The first imaging optical system K1 is constituted, successively from the mask side, by a first lens group G1 having a positive refracting power, an aperture stop S, and a second lens group G2 having a positive refracting power.

The second imaging optical system K2 is constituted, successively from the mask side, by a main mirror M1 having a surface-reflecting surface R1 with a concave surface directed onto the wafer side and an opening portion located at the center thereof, a lens component L2, and a sub-mirror M2, disposed on the wafer-side lens surface of the lens component L2, having a reflecting surface R2 with an opening portion located at the center thereof. From another viewpoint, the sub-mirror M2 and the lens component L2 constitute a rear-reflecting mirror, whereas the lens component L2 constitutes a refracting portion of the rear-reflecting mirror.

Here, all the optical elements (G1, G2, M1, and M2) constituting the projection optical system are arranged along a single optical axis AX. Also, the main mirror M1 is disposed near the position where the primary image I is formed, whereas the sub-mirror M2 is disposed close to the wafer 9.

As a consequence of the foregoing configuration, the light from the pattern of the mask 3 forms the primary image (intermediate image) I of the mask pattern by way of the first imaging optical system K1. The light from the primary image I is reflected by the sub-mirror M2 byway of the center opening portion of the main mirror M1 and the lens component L2, whereas the light reflected by the sub-mirror M2 is reflected by the main mirror M1 by way of the lens component L2. The light reflected by the main mirror M1 forms the secondary image of the mask pattern, under a reduced magnification, onto the surface of the wafer 9 by way of the lens component L2 and the center opening portion of the sub-mirror M2.

EXAMPLES

The present invention will now be explained in further detail with reference to Examples.

Manufacturing Examples of Calcium Fluoride Crystal

In the following, a specific procedure of making a calcium fluoride crystal will be explained. A powder material of calcium fluoride synthesized while lowering impurities as much as possible was stringently sealed and stored so as not to contain moisture and the like. A minute amount (0.5 to 1.5 [mol %]) of lead fluoride or polytetrafluoroethylene was added to the powder material as a fluorinating agent. Immediately thereafter, the resulting mixture was fully mixed by use of an agitator, and was heated and melted in a vacuum at $10^{-3}$ to $10^{-4}$ Pa, so as to form a polycrystalline substance. The surface of this polycrystalline substance was shaven with a debris of a calcium fluoride crystal, so as to eliminate impurities, and was further washed with ethanol. A $\phi 200$ carbon crucible was filled with 20 kg of the polycrystalline substance. After the system was set to $10^{-3}$ to $10^{-4}$ Pa, the temperature was raised to the melting point or higher over 2 days so as to eliminate oxygen and moisture from the surface, and the raised temperature was held for 8 hours. Thereafter, the temperature in the vicinity of a heater was set to 1370 to 1450° C. so as to melt the polycrystalline substance within the crucible, and the crucible was descended at a descending velocity of 0.5 to 3 mm/hour by a descending distance of 350 nm, so that a calcium fluoride crystal having a total length of 300 mm as an ingot was grown. Here, the temperature gradient at the time of crystal growth were varied among 15, 10, and 7° C./cm in the case where lead fluoride was used as the fluorinating agent, and between 10 and 8° C./cm in the case where polytetrafluoroethylene was used as the fluorinating agent, whereby five kinds of calcium fluoride crystals shown in Table 1 were obtained.

Measurement of Internal Transmittance

Subsequently, samples having thicknesses of 20 mm and 30 mm, respectively, each with a diameter of 60 mm, were prepared from each of the obtained calcium fluoride crystals.

A surface of each sample was mirror-polished with abrasive grains of diamond, and the transmittance taking account of reflection loss with respect to light having a wavelength of 140 to 240 nm was measured. The spectrophotometer used for measurement was VUV200 manufactured by JASCO Corporation.

Table 1 shows the transmittance of each sample taking account of reflection loss, and its internal transmittance per 10 mm calculated from that value. Though errors were large and differences were hardly seen among the individual samples in the case of the substrate thickness at 20 mm, clear differences were recognized in the case of the substrate thickness at 30 mm such that, for example, while the internal transmittance of the sample in accordance with Example 2 was 99.7±0.2[%/cm], the internal transmittance in Comparative Example 1 was 99.3±0.2[%/cm].

Measurement of Amount of Decrease in Internal Transmittance

Also, a sample having a diameter of 30 mm and a thickness of 30 mm was collected from each of the obtained calcium fluoride crystals, and its opposing two planes were optically ground with abrasive grains of diamond. This sample was irradiated with light emitted from an $F_2$ laser, and the spectral transmittance was measured before and after the light irradiation. Here, the employed $F_2$ laser has an output of 4 W and a repetition rate of 200 Hz, whereas its irradiation area is about 0.5×1.2 [cm$^2$], whereby the energy density per pulse (fluence) is 33 mJ/cm$^2$/pulse. FIGS. 3, 4, 5 and 6 show the results of measurement of the spectral transmittance in the calcium fluoride crystals in accordance with Example 1, Comparative Example 2, Example 2 and Comparative Example 3, respectively, before and after 10,000 pulses of light irradiation. Also, for each sample after 10,000 pulses of light irradiation, the amount of decrease in transmittance with respect to light having a specific wavelength of 157 nm was measured by use of the vacuum ultraviolet spectrophotometer VUV200 of JASCO Corporation. The results are shown in Table 1. In the case of samples using lead fluoride as the fluorinating agent, their amount of decrease in internal transmittance increased, i.e., 1.2%, 6.0%, and 30.0%, as their temperature gradient decreased. Also, similarly, in the case of samples using polytetrafluoroethylene as the fluorinating agent, their amount of decrease in internal transmittance increased, i.e., 1.5% and 8.2%, as their temperature gradient decreased. Here, the amount of decrease in transmittance per 10 mm was calculated from the measured value concerning the sample having a thickness of 30 mm by use of Lambert's law.

The calcium fluoride crystals of Example 1 and 2 have no absorption band at 154 nm, and its amount of decrease in transmittance with respect to light having a wavelength of 157 nm after being irradiated with 10,000 pulses of the $F_2$ laser was a very small value of 0.4 and 0.5[%/cm], respectively. In the calcium fluoride crystals of Comparative Examples 1, 2 and 3, their amounts of decrease were 2.0, 11.2 and 2.8[%/cm], respectively, thus exceeding the permissible value in terms of optical designing.

mination optical system 2 and the projection optical system 8 were constituted by only the optical members made of the calcium fluoride crystals of Comparative Example 1, and the projection exposure apparatus of FIG. 1 in which the illumination optical system 2 and the projection optical system 8 were constituted by only the optical members made of the calcium fluoride crystals of Comparative Example 3 were manufactured.

Critical resolutions of these projection exposure apparatus were compared with one another.

In case of the projection exposure apparatus whose optical systems were constituted by the optical members made of calcium fluoride crystals using lead fluoride as the fluorinating agent(Example 1 and Comparative Example 1), while the projection exposure apparatus whose optical systems were constituted by only the optical members made of the calcium fluoride crystals of Example 1 was able to achieve a critical resolution of 80 nm, the critical resolution of the projection exposure apparatus whose optical systems were constituted by only the optical members made of the calcium fluoride crystals of Comparative Example 1 was 100 nm.

Similarly, in case of the projection exposure apparatus whose optical systems were constituted by the optical members made of calcium fluoride crystals using polytetrafluoroethylene as the fluorinating agent (Example 2 and Comparative Example 3), while the projection exposure apparatus whose optical systems were constituted by only the optical members made of the calcium fluoride crystals of Example 2 was able to achieve a critical resolution of 80 nm, the critical resolution of the projection exposure apparatus whose optical systems were constituted by only the optical members made of the calcium fluoride crystals of Comparative Example 3 was 100 nm.

When the optical member in accordance with the present invention excellent in its transmission property and durabil-

TABLE 1

| sample | Fluorinating agent | Temperature gradient at growth [° C./cm] | Absorption band at 154 nm | Transmittance to light at wavelength of 157 nm | | | | Amount of decrease in transmittance after $F_2$ irradiation [%/3 cm] | Amount of decrease in transmittance after $F_2$ irradiation [%/cm] |
|---|---|---|---|---|---|---|---|---|---|
| | | | | substrate thickness at 20 mm | | substrate thickness at 30 mm | | | |
| | | | | with reflection loss [%] | Internal transmittance [%/cm] | with reflection loss [%] | Internal transmittance [%/cm] | | |
| Example 1 | lead fluoride | 15 | no | 90.2 ± 0.5 | 99.9 ± 0.3 | 90.2 ± 0.5 | 99.8 ± 0.2 | 1.2 | 0.4 |
| Comparative Example 1 | lead fluoride | 10 | yes | 89.8 ± 0.5 | 99.4 ± 0.3 | 89.0 ± 0.5 | 99.3 ± 0.2 | 6.0 | 2.0 |
| Comparative Example 2 | lead fluoride | 7 | yes | 89.6 ± 0.5 | 99.2 ± 0.3 | 88.8 ± 0.5 | 98.8 ± 0.2 | 30.0 | 11.2 |
| Example 2 | polytetrafluoroethylene | 10 | no | 90.1 ± 0.5 | 99.6 ± 0.3 | 90.1 ± 0.5 | 99.7 ± 0.2 | 1.5 | 0.5 |
| Comparative Example 3 | polytetrafluoroethylene | 8 | yes | 90.0 ± 0.5 | 99.6 ± 0.3 | 89.2 ± 0.5 | 99.4 ± 0.2 | 8.2 | 2.8 |

Critical Resolution of Projection Exposure Apparatus

The calcium fluoride crystals manufactured in Example 1 were used for making optical members constituting the illumination optical system 2 and the projection optical system 8 of FIG. 2. These optical members were used for making the projection exposure apparatus of FIG. 1 in which the illumination optical system 2 and the projection optical system 8 were constituted by only the optical members made of the calcium fluoride crystals of Example 1. Also, similarly, the projection exposure apparatus of FIG. 1 in which the illumination optical system 2 and the projection optical system 8 were constituted by only the optical members made of the calcium fluoride crystals of Example 2, the projection exposure apparatus of FIG. 1 in which the illuity is employed in an optical system, the transmission property of the whole optical system improves, and the imaging performances can be prevented from deteriorating due to the light absorption. A photolithography apparatus having an optical system constituted by such an optical member enables finer processing when vacuum ultraviolet light such as $F_2$ laser light is utilized.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. An optical member for photolithography comprising a calcium fluoride crystal exhibiting an internal transmittance of 99.5%/cm or greater with respect to light emitted from an $F_2$ laser, wherein said calcium fluoride crystal is obtained by use of polytetrafluoroethylene as a fluorinating agent to cause the calcium fluoride crystal to exhibit the internal transmittance of 99.5%/cm or greater with respect to light emitted from an $F_2$ laser.

2. An optical member according to claim 1, wherein an amount of decrease in internal transmittance when irradiated with light having an energy density of 50 mJ/cm$^2$/pulse or less is 0.5% or less per 10 mm.

3. An optical member according to claim 1, wherein said optical member exhibits an internal transmittance of 98.5% per 30 mm or greater.

4. An optical member according to claim 1, wherein said calcium fluoride crystal is obtained by use of at least 0.5 mol. % of the fluorinating agent.

5. An optical member according to claim 4, wherein said calcium fluoride crystal is obtained by use of 0.5–1.5 mol. % of the fluorinating agent.

6. A photolithography apparatus comprising an exposure light source for emitting light having a wavelength of 185 nm or shorter, a mask formed with an original image of a pattern, an irradiation optical system for irradiating said mask with the light emitted from said light source, a projection optical system for projecting onto a photosensitive substrate a pattern image projected from said mask, and an alignment system for aligning said mask and said photosensitive substrate with each other;

wherein at least a part of optical members constituting said irradiation optical system and projection optical system is made of a calcium fluoride crystal exhibiting an internal transmittance of 99.5%/cm or greater with respect to light emitted from an $F_2$ laser, wherein said calcium fluoride crystal is obtained by use of polytetrafluoroethylene as a fluorinating agent to cause the calcium fluoride crystal to exhibit the internal transmittance of 99.5%/cm or greater with respect to light emitted from an $F_2$ laser.

7. A photolithography apparatus according to claim 6, wherein said calcium fluoride crystal is obtained by use of at least 0.5 mol. % of the fluorinating agent.

8. A photolithography apparatus according to claim 7 wherein said calcium fluoride crystal is obtained by use of 0.5–1.5 mol. % of the fluorinating agent.

9. An optical system for photolithography comprising an optical member which comprises a calcium fluoride crystal exhibiting an internal transmittance of 99.5%/cm or greater with respect to light emitted from an $F_2$ laser, wherein said calcium fluoride crystal is obtained by use of polytetrafluoroethylene as a fluorinating agent to cause the calcium fluoride crystal to exhibit the internal transmittance of 99.5%/cm or greater with respect to light emitted from an $F_2$ laser.

10. An optical system according to claim 9, wherein said optical member exhibits an amount of decrease in transmittance of 0.5% or less per 10 mm when irradiated with light having an energy density of 50 mJ/cm$^2$/pulse or less.

11. An optical system according to claim 9, wherein said optical member exhibits an internal transmittance of 98.5% per 30 mm or greater.

12. An optical system according to claim 9, wherein said calcium fluoride crystal is obtained by use of at least 0.5 mol. % of the fluorinating agent.

13. An optical system according to claim 12 wherein said calcium fluoride crystal is obtained by use of 0.5–1.5 mol. % of the fluorinating agent.

14. An optical member for photolithography comprising a calcium fluoride crystal exhibiting an internal transmittance of 99.5%/cm or greater with respect to light emitted from an $F_2$ laser, wherein said calcium fluoride crystal is obtained by use of at least 0.5 mol. % of a fluorinating agent to cause the calcium fluoride crystal to exhibit the internal transmittance of 99.5%/cm or greater with respect to light emitted from an $F_2$ laser.

15. An optical member according to claim 14, wherein said calcium fluoride crystal is obtained by use of 0.5–1.5 mol. % of the fluorinating agent.

16. A photolithography apparatus comprising an exposure light source for emitting light having a wavelength of 185 nm or shorter, a mask formed with an original image of a pattern, an irradiation optical system for irradiating said mask with the light emitted from said light source, a projection optical system for projecting onto a photosensitive substrate a pattern image projected from said mask, and an alignment system for aligning said mask and said photosensitive substrate with each other;

wherein at least a part of optical members constituting said irradiation optical system and projection optical system is made of a calcium fluoride crystal exhibiting an internal transmittance of 99.5%/cm or greater with respect to light emitted from an $F_2$ laser, and wherein said calcium fluoride crystal is obtained by use of at least 0.5 mol. % of a fluorinating agent to cause the calcium fluoride crystal to exhibit the internal transmittance of 99.5%/cm or greater with respect to light emitted from an $F_2$ laser.

17. A photolithography apparatus according to claim 16, wherein said calcium fluoride crystal is obtained by use of 0.5–1.5 mol. % of the fluorinating agent.

18. An optical system for photolithography comprising an optical member which comprises a calcium fluoride crystal exhibiting an internal transmittance of 99.5%/cm or greater with respect to light emitted from an $F_2$ laser, wherein said calcium fluoride crystal is obtained by use of at least 0.5 mol. % of a fluorinating agent to cause the calcium fluoride crystal to exhibit the internal transmittance of 99.5%/cm or greater with respect to light emitted from an $F_2$ laser.

19. An optical system according to claim 18 wherein said calcium fluoride crystal is obtained by use of 0.5–1.5 mol. % of the fluorinating agent.

20. An optical member for photolithography comprising a calcium fluoride crystal exhibiting an internal transmittance of 99.5%/cm or greater with respect to light emitted from an $F_2$ laser, wherein said calcium fluoride crystal is obtained by use of a fluorine-containing resin as a fluorinating agent to cause the calcium fluoride crystal to exhibit the internal transmittance of 99.5%/cm or greater with respect to light emitted from an $F_2$ laser.

21. A photolithography apparatus comprising an exposure light source for emitting light having a wavelength of 185 nm or shorter, a mask formed with an original image of a pattern, an irradiation optical system for irradiating said mask with the light emitted from said light source, a projection optical system for projecting onto a photosensitive substrate a pattern image projected from said mask, and an alignment system for aligning said mask and said photosensitive substrate with each other;

wherein at least a part of optical members constituting said irradiation optical system and projection optical system is made of a calcium fluoride crystal exhibiting an internal transmittance of 99.5%/cm or greater with respect to light emitted from an $F_2$ laser, and wherein said calcium fluoride crystal is obtained by use of a fluorine-containing resin as a fluorinating agent to cause the calcium fluoride crystal to exhibit the internal transmittance of 99.5%/cm or greater with respect to light emitted from an $F_2$ laser.

22. An optical system for photolithography comprising an optical member which comprises a calcium fluoride crystal exhibiting an internal transmittance of 99.5%/cm or greater with respect to light emitted from an $F_2$ laser, wherein said calcium fluoride crystal is obtained by use of a fluorine-containing resin as a fluorinating agent to cause the calcium fluoride crystal to exhibit the internal transmittance of 99.5%/cm or greater with respect to light emitted from an $F_2$ laser.

\* \* \* \* \*